(12) United States Patent
Mori et al.

(10) Patent No.: US 10,498,337 B2
(45) Date of Patent: Dec. 3, 2019

(54) LEVEL SHIFT DEVICE AND IC DEVICE

(71) Applicant: KABUSHIKI KAISHA TOKAI RIKA DENKI SEISAKUSHO, Aichi (JP)

(72) Inventors: Yuichiro Mori, Aichi (JP); Junichi Matsubara, Aichi (JP); Natsuki Arakawa, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 16/230,144

(22) Filed: Dec. 21, 2018

(65) Prior Publication Data

US 2019/0214992 A1 Jul. 11, 2019

(30) Foreign Application Priority Data

Jan. 9, 2018 (JP) .................................. 2018-001488

(51) Int. Cl.
*H03L 5/00* (2006.01)
*H03K 19/0175* (2006.01)
*H03K 19/0185* (2006.01)
*H03K 3/0233* (2006.01)

(52) U.S. Cl.
CPC ... *H03K 19/018507* (2013.01); *H03K 3/0233* (2013.01)

(58) Field of Classification Search
CPC .................. H03K 19/018507; H03K 3/0233
See application file for complete search history.

(56) References Cited

U.S. PATENT DOCUMENTS

| 5,534,795 | A | * | 7/1996 | Wert ................ | H03K 19/00315 326/58 |
| 5,646,550 | A | * | 7/1997 | Campbell, Jr. .... | H03K 19/0013 326/121 |
| 6,147,540 | A | * | 11/2000 | Coddington ....... | H03K 19/0027 327/333 |
| 6,181,193 | B1 | * | 1/2001 | Coughlin, Jr. ... | H03K 19/00315 327/108 |
| 6,724,226 | B2 | * | 4/2004 | Kim ..................... | G11C 7/1078 326/81 |

(Continued)

FOREIGN PATENT DOCUMENTS

| JP | 2011-119979 A | 6/2011 |
| JP | 2017-055214 A | 3/2017 |

*Primary Examiner* — Kenneth B Wells
(74) *Attorney, Agent, or Firm* — Roberts Mlotkowski Safran Cole & Calderon, P.C.

(57) ABSTRACT

A level shift device includes a high breakdown voltage element in which a voltage of an internal power supply part is applied to a gate, an external input signal is input from outside to one of a source and a drain, and the other one of the source and the drain outputs an intermediate output signal of the same phase as that of the external input signal, and a comparator comparing the intermediate output signal with a threshold value so as to perform conversion into a Hi/Lo signal defined by a voltage of the internal power supply part and outputting the signal to an internal processing circuit. The high breakdown voltage element, the comparator, the processing circuit, and the internal power supply part are enclosed in the device.

14 Claims, 3 Drawing Sheets

(56) References Cited

U.S. PATENT DOCUMENTS

| | | | | |
|---|---|---|---|---|
| 6,853,233 | B1* | 2/2005 | Terletzki | H03K 19/09429 |
| | | | | 326/63 |
| 7,173,472 | B2* | 2/2007 | Chen | H03K 19/0027 |
| | | | | 326/81 |
| 7,236,002 | B2* | 6/2007 | Salzmann | H03K 19/00315 |
| | | | | 326/14 |
| 7,336,117 | B2* | 2/2008 | La Malfa | H03K 3/356104 |
| | | | | 326/80 |
| 7,768,309 | B2* | 8/2010 | Luich | H03K 19/018528 |
| | | | | 326/126 |
| 7,863,962 | B2* | 1/2011 | Pasqualini | H03K 19/00315 |
| | | | | 326/81 |
| 8,106,699 | B2* | 1/2012 | Shankar | H03K 19/018507 |
| | | | | 326/62 |
| 8,149,644 | B2* | 4/2012 | Fujioka | G11C 7/1051 |
| | | | | 326/80 |
| 2007/0057694 | A1 | 3/2007 | Salzmann et al. | |
| 2011/0133562 | A1 | 6/2011 | Koashi | |

* cited by examiner

LEVEL SHIFT DEVICE AND IC DEVICE

CROSS REFERENCE TO RELATED APPLICATIONS

The present application is based on Japanese patent application No. 2018-001488 filed on Jan. 9, 2018, the entire contents of which are incorporated herein by reference.

TECHNICAL FIELD

The present invention relates to a level shift device and an IC device.

BACKGROUND ART

A level shift circuit for outputting an input signal input from a first circuit as an output signal to a second circuit is disclosed as a level shift device (for example, see patent document 1).

This level shift device is configured including: a first switching element connected between a first circuit operating at a first power supply voltage and a second circuit operating at a second power supply voltage, which is higher than the first power supply voltage, and configured to output a signal input at one end thereof to the other end thereof; a transmission circuit configured to supply the first or second power supply voltage to the other end of the first switching element via a resistance element; and a control circuit configured to supply a current to the other end of the first switching element in the same direction as a current flowing through the resistance element when the first switching element is in the OFF state.

CITATION LIST

Patent Literature

Patent Document 1: JP 2011-119979 A

SUMMARY OF INVENTION

Technical Problem

However, in a conventional level shift device, an input signal input from the aforementioned first circuit to the level shift device is a signal operating at the first power supply voltage as indicated above. For this reason, when there are input signals defined by different power supply voltages, for example, in a case where there are a signal based on 5V and also a signal defined by a vehicle battery voltage 12V, level shift devices corresponding to respective voltage systems have to be used.

Accordingly, the object of the present invention is to provide a level shift device compatible with different voltage systems, and an IC device equipped with the level shift device.

Solution to Problem

In one embodiment of the present invention, a level shift device includes: a high breakdown voltage element in which a voltage of an internal power supply part is applied to a gate, an external input signal is input from outside to one of a source and a drain, and the other one of the source and the drain outputs an intermediate output signal of the same phase as that of the external input signal; and a comparator comparing the intermediate output signal with a threshold value so as to perform conversion into a Hi/Lo signal defined by a voltage of the internal power supply part and outputting the signal to an internal processing circuit, wherein the level shift device includes therein the high breakdown voltage element, the comparator, the processing circuit, and the internal power supply part.

A different aspect of the present invention may be an IC device.

Advantageous Effects of Invention

The level shift device and the IC device according to the present invention are compatible with different voltage systems.

DESCRIPTION OF EMBODIMENT

Embodiments of the Invention

A level shift device 1 according to an embodiment of the present invention is configured including: a high breakdown voltage element in which a voltage $V_{DD}$ of an internal power supply part 10 is applied to a gate G, an external input signal Vin is input from outside to one of a source S and a drain D, and the other one of the source S and the drain D outputs an intermediate output signal Vm of the same phase as that of the external input signal Vin; and a comparator comparing the intermediate output signal Vm with a threshold value Vth so as to perform conversion into a Hi/Lo signal defined by a voltage VDD of the internal power supply part 10 and outputting the signal to an internal processing circuit 40, wherein the level shift device includes therein a DMOS 20 as the high breakdown voltage element, a comparator 30 as the comparator, the processing circuit 40, and the internal power supply part 10.

Configuration of the Level Shift Device 1

Figure 1:
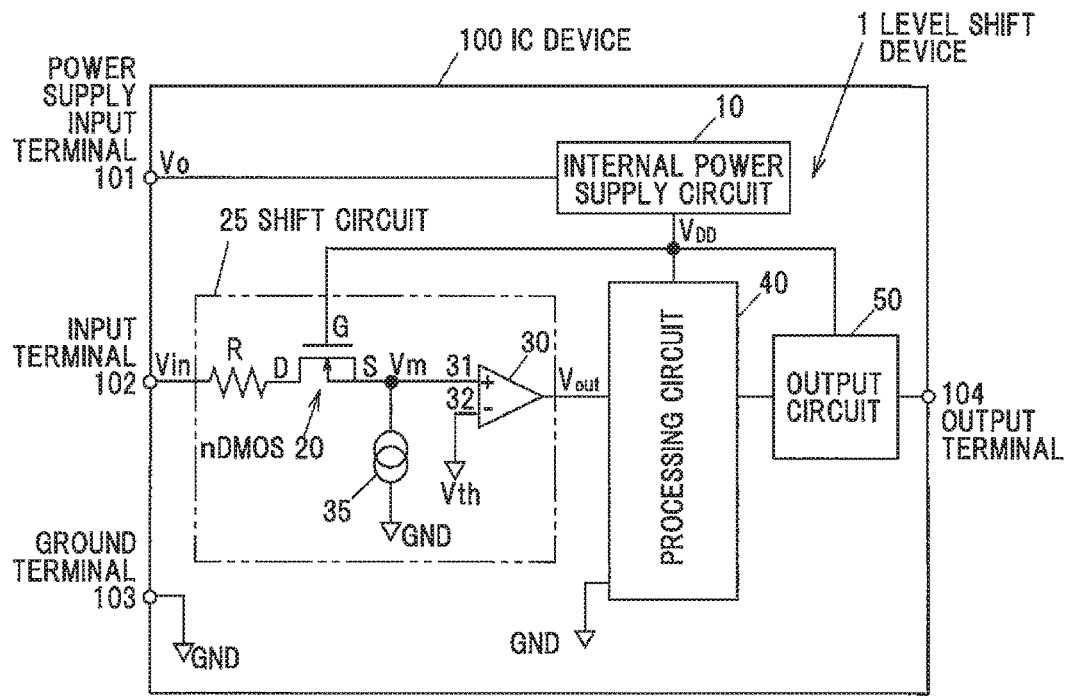
FIG. 1 is an overall configuration diagram of a level shift device and an IC device according to an embodiment of the present invention.

FIG. 1 is an overall configuration diagram of the level shift device 1 and an IC device 100 according to an embodiment of the present invention. As illustrated in FIG. 1, the level shift device 1 is configured from an internal power supply 10 configured to generate an internal voltage $V_{DD}$ based on an external power supply voltage $V_0$ supplied from an external power supply, a DMOS 20 configured to operate on an internal voltage $V_{DD}$, a comparator 30, and a processing circuit 40.

As illustrated in FIG. 1, the level shift device 1 and the IC device 100 may be provided with an output circuit 50 configured to supply a current to a load circuit connected to an output terminal, based on an output signal of the processing circuit 40.

Further, as illustrated in FIG. 1, in an output part of the intermediate output signal of the DMOS 20, a constant current source 35 may be provided as pull-down means to ensure, when an output part is in a Lo level, the Lo level.

Internal Power Supply Part 10

As illustrated in FIG. 1, the internal power supply part 10 is connected to a power supply input terminal 101 through which power is supplied from an external power supply to the inside of the level shift device 1 and the IC device 100. The internal power supply part 10 is also connected to the DMOS 20, the comparator 30, the processing circuit 40, and the like, for supply of an internal voltage $V_{DD}$ generated at the internal power supply part 10.

The internal power supply unit 10 is a power supply unit that generates an internal voltage $V_{DD}$ based on an external power supply voltage $V_0$ supplied from an external power supply. The external power supply voltage $V_0$ is, for example, 5V, 12V, which is the battery power supply voltage of a vehicle and the like. The internal voltage $V_{DD}$ is, for example, 3.3V, 5V, or the like.

DMOS 20 as the High Breakdown Voltage Element

As illustrated in FIG. 1, an explanation will be given assuming that an n-channel DMOS 20 is used as the high breakdown voltage element. Note that a p-channel DMOS may also be used, in which case the source S is connected to the input side and the drain D is connected to the output side.

A Double-Diffused MOS (DMOS) has a basic structure of a power MOSFET. A Power DMOS is a DMOS designed to cope with high power, has a faster switching speed and higher conversion efficiency in a low voltage range than other power devices, and therefore is used, in the region of 200V or less, mainly for switching power supplies, DC-DC converters, and the like. The basic structure, in the case of the N channel type, has a low concentration P type layer (P body) and a high concentration N type layer, which are formed by double diffusion on the surface side of the N epitaxial layer which is formed on the N+ substrate, with a large number of such structures (unit cells) connected in parallel.

Figure 2:
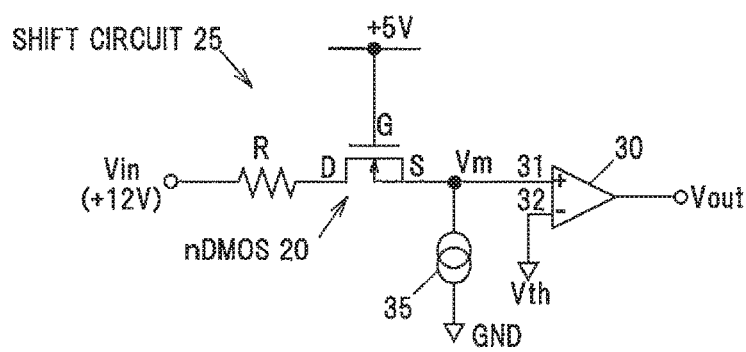
FIG. 2 is a circuit configuration diagram of a level shift device according to an embodiment of the present invention.

As illustrated in FIGS. 1 and 2, the drain D of the DMOS 20 is connected to an input terminal 102 via a resistor R. An external input signal Vin defined by an external power supply voltage is input to the input terminal 102. The gate G is connected to the internal power supply part 10 so that the internal voltage $V_{DD}$ is always applied. In addition, the source S is connected to a non-inverting input terminal 31 of the comparator 30 and the constant current source 35. The output of the source S is output as the intermediate output signal Vm.

In the present embodiment, as illustrated in FIG. 2, an explanation will be given assuming a 12V external power supply voltage system and a 5V internal power supply voltage system.

Comparator 30 as the Comparator

As illustrated in FIGS. 1, 2, the comparator 30 is configured by an operational amplifier, for example. To the non-inverting input terminal 31 of the comparator 30, the intermediate output signal Vm is applied. One end of the constant current source 35 is also connected. On the other hand, a threshold voltage Vth as a reference voltage is input to the inverting input terminal 32. This threshold voltage Vth is, for example, set to ½ of the voltage $V_{DD}$ of the internal power supply part 10, namely to about 2.5V. In such a configuration, the comparator 30 converts the intermediate output signal Vm, which is the inputted signal, into the Hi/Lo signal defined by a voltage $V_{DD}$ of the internal power supply part, by comparing the same with the threshold value Vth, and outputs the output signal Vout to the internal processing circuit 40.

As a modification, the comparator 30 may simply have a configuration in which an inverter is used. By comparing a threshold value (internal transition voltage) of the inverter with the input voltage, the inverter may be made to function as a comparator. By using an inverter, the circuit area can be made smaller than when the comparator is used.

As illustrated in FIGS. 1 and 2, a shift circuit part 25 is configured from the aforementioned DMOS 20 and the comparator 30. The Vout of the shift circuit part 25 serves as an input signal processing circuit 40.

Constant Current Source 35

In the present embodiment, a constant current source 35 is provided as pull-down means. The pull-down means is to ensure, when the output part is in a Lo level, the Lo level. One end of the constant current source 35 is connected to the source S of the DMOS 20 and the inverting input terminal 32 of the comparator 30, and the other end is connected to the ground GND. The constant current source 35 may be configured from various circuits, such as a constant current circuit composed of a transistor and a resistor and a mirror circuit composed of a plurality of transistors, for example.

Processing Circuit 40

The processing circuit 40 is, for example, a logic circuit that operates at a 5V internal power supply. For example, the processing circuit is configured to determine the output in a given logic according to the output $V_{OUT}$ of the shift circuit part 25. In one example, when a LED is connected to an output terminal 104, the processing circuit 40 generates a control signal for controlling lighting, blinking, and turning off of the LED by the external input signal Vin and the output Vout of the shift circuit part 25.

Output Circuit 50

The output circuit 50 is, for example, a driver circuit for supplying a current to an LED, which is a load, when the LED is connected to the output terminal. For example, the output circuit may be configured for a constant current output or an open drain output.

Operation of Level Shift Device 1

Figure 3:
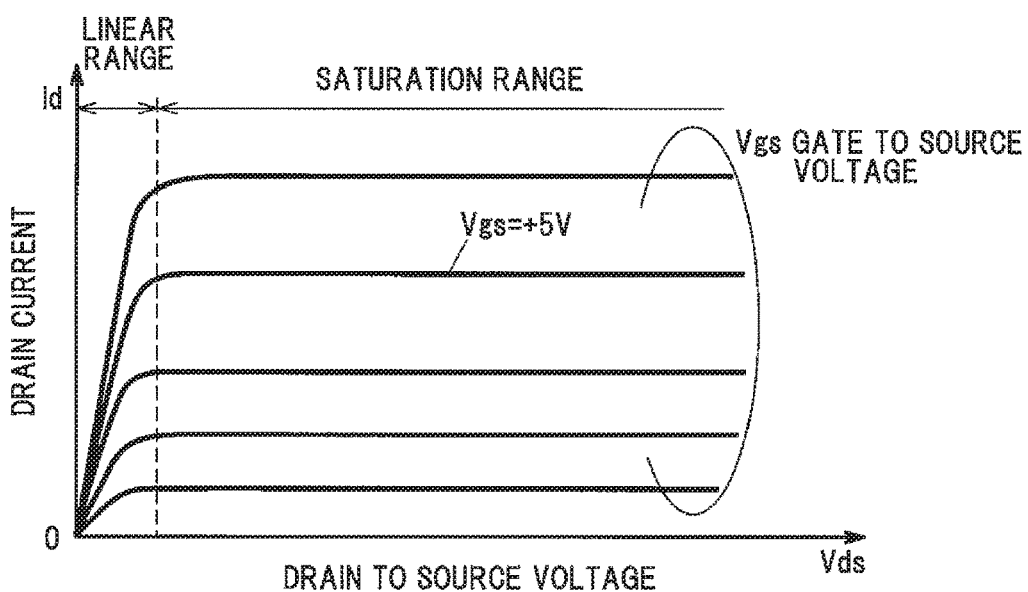
FIG. 3 illustrates the relationship between a drain-to-source voltage Vds and a drain current Id of a DMOS, and is a basic characteristic diagram of the DMOS when a gate-to-source voltage Vgs is used as a parameter.
Figure 4A:
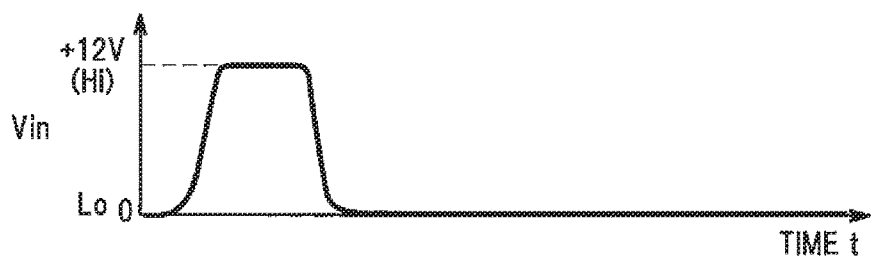
FIG. 4A is a signal waveform of an external input signal.
Figure 4B:
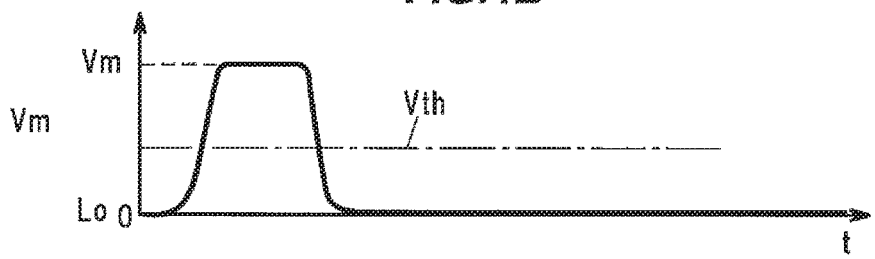
FIG. 4B is an intermediate output signal waveform Vm of the DMOS.
Figure 4C:
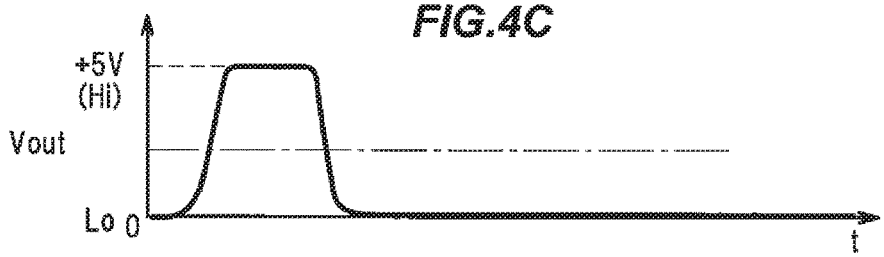
FIG. 4C is an output signal waveform Vout of the level shift device.

FIG. 3 illustrates the relationship between the drain-to-source voltage Vds and the drain current Id of the DMOS, and is a basic characteristic diagram of the DMOS when the gate-to-source voltage Vgs is used as a parameter. In addition, FIG. 4A illustrates a signal waveform of an external input signal. FIG. 4B illustrates an intermediate output signal waveform Vm of the DMOS, and FIG. 4C illustrates an output signal waveform Vout of the level shift device. Hereinafter, the operation of the level shift device 1 will be described with reference to FIGS. 3 and 4A to 4C.

As illustrated in FIG. 3, when the drain-to-source voltage Vds reaches or exceeds a certain value, the value of the drain current Id is nearly unchanged and becomes substantially constant. This characteristic is the same as when the gate-to-source voltage Vgs is changed as a parameter.

In FIG. 3, the flat range is referred to as the saturation range, and the range in which the drain-to-source voltage Vds is small and the drain current Id changes as the Vds changes is referred to as the linear range. In a case where a gate-to-source voltage Vgs is set, setting the threshold value appropriately such that the Hi level of the external input signal Vin is in the saturation range and the Lo level is in the linear range close to zero, enables the generation of a signal of the same phase as that of the external input signal Vin. Note that the signal of the same phase as that of the external input signal Vin includes a signal that follows the external input signal Vin and is phase-inverted with the external input signal Vin.

In the present embodiment, as illustrated in FIG. 3, the gate-to-source voltage Vgs is set to 5V to be always On, such that the Hi level of the external input signal Vin corresponds to a saturation range, in which the characteristics are flat, and the Lo level of the external input signal Vin corresponds to a linear range close to zero.

As illustrated in FIG. 4A, the external input signal Vin is a pulse signal of 12V at the Hi level and 0 (zero) at the Lo level. Almost the whole of the drain current Id flows to the ground GND via the constant current source 35 since the input impedance of the comparator 30 is sufficiently high. Referring to FIG. 2, the voltage of the intermediate output signal Vm of the DMOS 20 is obtained by subtracting about 0.6V, which is the voltage drop of the constant current source 35, from the voltage of the external input signal Vin. Therefore, the intermediate output signal Vm is, for example, a value close to the external power supply voltage V0. Accordingly, the intermediate output signal Vm of the DMOS 20, as illustrated in FIG. 4B, is a signal of the same phase at approximately the same level as that of the external input signal Vin.

In FIG. 4B, the threshold voltage Vth of the comparator 30 is set between 0 (zero) and Vm. Specifically, for example, the threshold voltage Vth is set to ½ of $V_{DD}$, namely, about 2.5 V. With such a setting, the output of the comparator 30 and the output Vout of the shift circuit section 25 are of the same phase as the external input signal Vin, and are pulse signals of 5V at the Hi level and 0 (zero) at the Lo level. The output Vout of the shift circuit part 25 may serve as the input signal of the processing circuit 40, which is a logic circuit.

(Modification)

Figure 5:
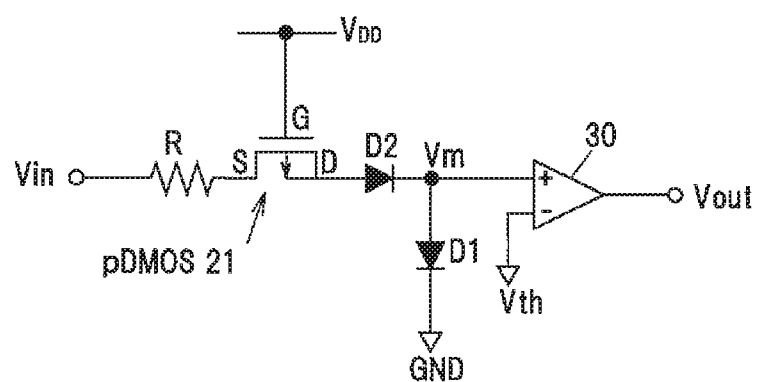
FIG. 5 is a modification of the level shift device illustrated in FIG. 2, and is a circuit configuration diagram of a level shift device in which diodes are used for a p-channel DMOS and a constant current source.

FIG. 5 is a modification of the level shift device illustrated in FIG. 2, and is a circuit configuration diagram of a level shift device in which diodes D1 and D2 are used for the p-channel DMOS 21 and the constant current source. Since the p-channel DMOS 21 is used, the source S is connected to the input side, and the drain D is connected to the output side. The diodes D2 and D1 are connected to the drain D and are connected to the ground GND. The non-inverting input terminal 31 of the comparator 30 is connected between the diodes D2 and D1. Other configurations are the same as those described above.

Even in such a configuration, the voltage of the intermediate output signal Vm of the DMOS 20 is obtained by subtracting about 0.6V, which is the voltage drop of the diode D1, from the voltage of the external input signal Vin. Therefore, the intermediate output signal Vm is, for example, a value close to the external power supply voltage $V_0$. Accordingly, the intermediate output signal Vm of the DMOS 21, as illustrated in FIG. 4B, is a signal of the same phase at approximately the same level as that of the external input signal Vin.

Further, in place of the constant current source 35 and the diode D1, it is also possible to use a pull-down resistor. Setting the pull-down resistance value to a sufficiently small value enables it to function as a pull-down means to ensure, when the output part is in a Lo level, the Lo level, similarly to the constant current source 35 and the diode D1.

(Embodiment as IC Device 100)

The IC device 100, including the level shift device 1 described above and formed by packaging therein the high breakdown voltage element, the processing circuit, the comparator, and the power supply voltage, is also one of the present embodiment.

The IC device 100, as illustrated in FIG. 1, is formed by including and packaging, inside the IC, an internal power supply section 10, a DMOS 20, the comparator 30, the constant current source 35, the processing circuit 40, the output circuit 50 and the like. As terminals for the IC device 100, the power input terminal 101 configured to input the battery power supply, the input terminal 102 configured to input an external input signal Vin, a ground terminal 103, the output terminal 104 configured to connect with the load circuit, and the like are provided. Note that the input terminal 102 and the output terminal 104 may be provided in plurality.

Effect of Embodiments

According to embodiments of the present invention, effects such as those described below are achieved.

(1) A level shift device 1 according to an embodiment of the invention is configured including: a high breakdown voltage element in which a voltage $V_{DD}$ of an internal power supply part 10 is applied to a gate G, an external input signal Vin is input from outside to one of a source S and a drain D, and the other one of the source S and the drain D outputs an intermediate output signal Vm of the same phase as that of the external input signal Vin; and a comparator comparing the intermediate output signal Vm with a threshold value Vth so as to perform conversion into a Hi/Lo signal defined by a voltage $V_{DD}$ of the internal power supply part 10 and outputting the signal to an internal processing circuit 40, wherein the level shift device includes therein a DMOS 20 as the high breakdown voltage element, a comparator 30 as the comparator, the processing circuit 40, and the internal power supply part 10. No destruction will occur even if the external input signal Vin exceeds the voltage $V_{DD}$ of the internal power supply section 10, because the DMOS 20 is configured as a DMOS, which is a high breakdown voltage element. Namely, although the drain voltage Vds varies according to the external input signal Vin, since the DMOS bears most of the load of a voltage drop at the DMOS, the intermediate output signal Vm will not exceed the destruction voltage of later stage low breakdown voltage elements (the comparator 30, the processing circuit 40 and the like).

(2) With the above configuration, a circuit capable of receiving a battery voltage input is incorporated within the IC, thereby enabling the direct receipt of the input of a battery voltage. Using a high breakdown voltage element in the input circuit and setting the threshold value to 5V or less so as to make a configuration also capable of receiving non-battery-driven 5V input makes it possible to obtain a level shift device capable of coping with both a 5V input and a battery voltage input in the same IC and being compatible with different voltage systems.

(3) In addition, since it is capable of accepting the input of a battery voltage with no external circuit, the effect of reduction in component cost and reduction in board area can be achieved. Further, since the same IC may be used for vehicles designed for battery input and vehicles designed for 5V input, an effect of reduction in IC price may be expected due to the mass production effect.

Several embodiments and modifications of the invention have been described above, but these embodiments and modifications are merely examples and do not limit the invention according to the claims. In addition, these novel embodiments and modifications can be implemented in various other forms, and various omissions, substitutions, changes, or the like can be made without departing from the gist of the present invention. In addition, all combinations of features described in these embodiments and modifications are not necessarily essential to the means for solving the problem of the invention. Further, these embodiments and modifications are included in the scope and gist of the invention, and are also included in the invention described in the claims and the equivalent scope thereof.

REFERENCE SIGNS LIST

1 Level shift device
10 Internal power supply part
20 DMOS
25 Shift circuit part
30 Comparator
31 Non-inverting input terminal
32 Inverting input terminal
35 Constant current source
40 Processing circuit
50 Output circuit
100 IC device
101 Power supply input terminal
102 Input terminal
103 Ground terminal
104 Output terminal

The invention claimed is:

1. A level shift device, comprising:
a high breakdown voltage element in which a voltage of an internal power supply part is applied to a gate, an external input signal is input from outside to one of a source and a drain, and the other one of the source and the drain outputs an intermediate output signal of the same phase as that of the external input signal; and
a comparator comparing the intermediate output signal with a threshold value so as to perform conversion into a Hi/Lo signal defined by the voltage of the internal power supply part and outputting the signal to an internal processing circuit,
wherein the high breakdown voltage element, the comparator, the processing circuit, and the internal power supply part are enclosed in the device,
wherein an output part of the high breakdown voltage element is coupled to a pull-down means to ensure, when the output part is in a Lo level, the Lo level, and
wherein the pull-down means comprises a constant current source.

2. The level shift device according to claim 1, wherein the high breakdown voltage element comprises a Double-Diffused MOS (DMOS) element.

3. The level shift device according to claim 1, wherein the high breakdown voltage element is configured to be in a saturation range, in which a drain current flowing between the drain and the source is saturated, when a voltage of the internal power supply part is applied to the gate and the external input signal is a Hi level signal.

4. The level shift device according to claim 1, wherein the threshold value is set to ½ of a voltage of the internal power supply part.

5. The level shift device according to claim 1, wherein the external input signal includes at least a signal defined by a battery power supply voltage of a vehicle.

6. An IC device, comprising a level shift device according to claim 1, and formed by packaging therein the high breakdown voltage element, the processing circuit, the comparator, and the internal power supply part.

7. The level shift device according to claim 1, wherein one terminal of the constant current source is connected with a non-inverting input terminal of the comparator and an other terminal thereof is connected with a ground.

8. A level shift device, comprising:
a high breakdown voltage element in which a voltage of an internal power supply part is applied to a gate, an external input signal is input from outside to one of a source and a drain, and the other one of the source and the drain outputs an intermediate output signal of the same phase as that of the external input signal; and
a comparator comparing the intermediate output signal with a threshold value so as to perform conversion into a Hi/Lo signal defined by the voltage of the internal power supply part and outputting the signal to an internal processing circuit,
wherein the high breakdown voltage element, the comparator, the processing circuit, and the internal power supply part are enclosed in the device,
wherein an output part of the high breakdown voltage element is coupled to a pull-down means to ensure, when the output part is in a Lo level, the Lo level, and
wherein the pull-down means comprises a diode.

9. The level shift device according to claim 8, wherein the high breakdown voltage element comprises a Double-Diffused MOS (DMOS) element.

10. The level shift device according to claim 8, wherein the high breakdown voltage element is configured to be in a saturation range, in which a drain current flowing between the drain and the source is saturated, when a voltage of the internal power supply part is applied to the gate and the external input signal is a Hi level signal.

11. The level shift device according to claim 8, wherein the threshold value is set to ½ of a voltage of the internal power supply part.

12. The level shift device according to claim 8, wherein the external input signal includes at least a signal defined by a battery power supply voltage of a vehicle.

13. An IC device, comprising a level shift device according to claim 8, and formed by packaging therein the high breakdown voltage element, the processing circuit, the comparator, and the internal power supply part.

14. The level shift device according to claim 8, wherein one terminal of the constant current source is connected with a non-inverting input terminal of the comparator and an other terminal thereof is connected with a ground.

* * * * *